US010776912B2

(12) United States Patent
Yin et al.

(10) Patent No.: US 10,776,912 B2
(45) Date of Patent: Sep. 15, 2020

(54) SELF-DETERMINING INSPECTION METHOD FOR AUTOMATED OPTICAL WIRE BOND INSPECTION

(71) Applicant: AGENCY FOR SCIENCE, TECHNOLOGY AND RESEARCH, Singapore (SG)

(72) Inventors: Xiaoming Yin, Singapore (SG); Jian Xu, Singapore (SG)

(73) Assignee: AGENCY FOR SCIENCE, TECHNOLOGY AND RESEARCH, Singapore (SG)

(*) Notice: Subject to any disclaimer, the term of this patent is extended or adjusted under 35 U.S.C. 154(b) by 110 days.

(21) Appl. No.: 16/082,851

(22) PCT Filed: Mar. 9, 2017

(86) PCT No.: PCT/SG2017/050116
§ 371 (c)(1),
(2) Date: Sep. 6, 2018

(87) PCT Pub. No.: WO2017/155470
PCT Pub. Date: Sep. 14, 2017

(65) Prior Publication Data
US 2019/0035069 A1    Jan. 31, 2019

(30) Foreign Application Priority Data
Mar. 9, 2016    (SG) .............................. 10201601820S (51) Int. Cl.
*G06K 9/00*    (2006.01)
*G06T 7/00*    (2017.01)
(Continued)

(52) U.S. Cl.
CPC ............ *G06T 7/001* (2013.01); *G06K 9/4614* (2013.01); *G06K 9/4628* (2013.01); *H01L 23/48* (2013.01); *G06T 2207/30148* (2013.01)

(58) Field of Classification Search
CPC ................... G06T 7/001; G06T 7/0004; G06T 2207/30148; G06K 9/4614; G06K 9/4628; G01N 21/9501; G01N 21/95607
See application file for complete search history.

(56) References Cited

U.S. PATENT DOCUMENTS 5,138,180 A     8/1992   Yamanaka
5,170,062 A  *  12/1992  Miyahara ................ H01L 24/85
                                                250/559.07
(Continued)

FOREIGN PATENT DOCUMENTS

JP      2005-147665 A      6/2005
WO      2010090605 A1      8/2010
WO   WO 2015186236 A1     12/2015

OTHER PUBLICATIONS

Lienhart, et al., "An Extended Set of Haar-like Features for Rapid Object Detection," IEEE ICIP, 2002, pp. 900-903, IEEE, 4 pages.
(Continued)

*Primary Examiner* — Amir Alavi
(74) *Attorney, Agent, or Firm* — Womble Bond Dickinson (US) LLP (57) ABSTRACT

Systems and methods for self-determining optical inspection of wire bonds of semiconductor components. The method is an automated optical wire bond inspection method that may include obtaining an image of a semiconductor component having wire bonds. The method may also include detecting a plurality of wire bonds on the semiconductor component image so that a wire between at least two of the plurality of detected wire bonds may be detected. Further, the method may include determining an inspection region of interest
(Continued)

1001 corresponding to at least one detected wire bond and at least one detected wire. The method may then include inspecting the detected wire bond along the region of interest.

20 Claims, 6 Drawing Sheets (51) Int. Cl.
*G06K 9/46* (2006.01)
*H01L 23/48* (2006.01)

(56) References Cited

U.S. PATENT DOCUMENTS

| | | | |
|---|---|---|---|
| 5,581,632 | A | 12/1996 | Koljonen et al. |
| 5,640,199 | A | 6/1997 | Garakani et al. |
| 5,818,958 | A | 10/1998 | Tomiyama et al. |
| 5,861,909 | A | 1/1999 | Garakani et al. |
| 6,061,467 | A | 5/2000 | Michael |
| 6,118,893 | A | 9/2000 | Li |
| 7,272,032 | B2* | 9/2007 | Tsuji ............... G11C 11/16 365/157 |
| 7,417,719 | B2* | 8/2008 | Michelsson ......... G01D 1/14 356/237.1 |
| 7,452,657 | B2* | 11/2008 | Namiki ............ G03F 7/038 430/192 |
| 8,290,326 | B2* | 10/2012 | Furuyama ......... H05K 1/0274 385/129 |
| 8,608,388 | B2* | 12/2013 | Fukui ............. G02B 6/4201 385/88 |
| 8,843,424 | B2 | 9/2014 | Mei et al. |
| 9,495,738 | B2* | 11/2016 | Kato ................ G06T 7/0008 |
| 9,871,347 | B2* | 1/2018 | Hatori .............. H04B 10/40 |
| 2008/0144014 | A1* | 6/2008 | Vollrath ........... G01N 21/8806 356/73 |
| 2008/0197362 | A1* | 8/2008 | Hisamoto ........... G02B 6/13 257/86 |
| 2019/0035069 | A1* | 1/2019 | Yin ................. G06K 9/4628 |

OTHER PUBLICATIONS

Messom, et al., "Fast and Efficient Rotated Haar-like Features using Rotated Integral Images," International Journal of Intelligent Systems Technologies and Applications, Jan. 2009, 7 pages, New Zealand.

Papageorgiou, et al., "A General Framework for Object Detection," International Conference on Computer Vision, 1998, pp. 555-562, IEEE Computer Society, Washington, DC, US.

Viola, et al., "Rapid Object Detection using a Boosted Cascade of Simple Features," Computer Vision and Pattern Recognition, 2001, pp. 511-518.

IP Office of Singapore—Notification of Transmittal of the International Search Report & the Written Opinion of the International Searching Authority, or the Declaration, with the International Search Report & Written Opinion dated Jun. 6, 2017 for International Application No. PCT/SG2017/050116 (11 pgs).

IP Office of Singapore—International Preliminary Report on Patentability by the International Searching Authority dated Feb. 19, 2018 along with the Response to the Written Opinion and Article 34 Amendment submitted Dec. 24, 2017 for International Application No. PCT/SG2017/050116 (24 pgs).

* cited by examiner

SELF-DETERMINING INSPECTION METHOD FOR AUTOMATED OPTICAL WIRE BOND INSPECTION

CROSS-REFERENCE TO RELATED APPLICATIONS

This patent application is a U.S. National Phase application under 35 U.S.C. § 371 of International Application No. PCT/SG2017/050116 filed on 9 Mar. 2017, entitled SELF-DETERMINING INSPECTION METHOD FOR AUTOMATED OPTICAL WIRE BOND INSPECTION, which claims the benefit of priority of Singapore application No. 10201601820S filed on 9 Mar. 2016, the contents of which were incorporated by reference in their entirety for all purposes.

FIELD OF INVENTION

This invention is related to optical inspection of wire bonds of semiconductor components.

BACKGROUND

Wire bond technology plays an important role in the electronics industry. In light of the longstanding trend toward both semiconductor component complexity and miniaturization, semiconductor components are increasingly designed with greater numbers of interconnections on a smaller area. Moreover, given an industry emphasis on speed of assembly and cost reduction per interconnection, there is a need for rapid and reliable quality inspection of wire bonds.

SUMMARY OF INVENTION

In an effort to ensure consistent quality, each wire bond on a semiconductor component is generally inspected for quality. Optical inspection systems for wire bonds inspect regions of interest on a semiconductor component area, corresponding to wire bonds and wires. Such optical inspection systems have generally relied on manual definition of the regions of interest, which is a tedious and cumbersome procedure. Moreover, these optical systems have generally required manual definition of inspection features, such as inspection parameters and pass/fail criteria. Such parameters and criteria are stored in an inspection protocol and then retrieved for inspection. The creation and inputting of these criteria is tedious.

This Disclosure describes a system for a self-determining inspection method that eliminates much of the need for manual region of interest information by relying on image processing methods for recognition of wire bonds and automatic identification of regions of interest.

DETAILED DESCRIPTION

The following detailed description refers to the accompanying drawings that show, by way of illustration, specific details and aspects in which the Disclosure may be practiced.

The word "exemplary" is used herein to mean "serving as an example, instance, or illustration." Any embodiment or design described herein as "exemplary" is not necessarily to be construed as preferred or advantageous over other embodiments or designs.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more. The terms "proper subset", "reduced subset", and "lesser subset" refer to a subset of a set that is not equal to the set, i.e. a subset of a set that contains less elements than the set.

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit ("CPU"), Graphics Processing Unit ("GPU"), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions, which will be described below in further detail, may also be understood as a "circuit." It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, "memory" may be understood as a non-transitory computer-readable medium in which data or information can be stored for retrieval. References to "memory" included herein may thus be understood as referring to volatile or non-volatile memory, including random access memory ("RAM"), read-only memory ("ROM"), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component comprising one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

The term "semiconductor component" is used herein to refer to any chip, wafer, circuit, or component comprising wire bonds, wherein said wire bonds can be inspected with the system for inspection or in accordance with the method for inspection as disclosed herein. As used in this disclosure, the term "semiconductor component" may be singular or plural, such that it refers to one or more chips, wafers, circuits, or components comprising wire bonds.

Figure 1:
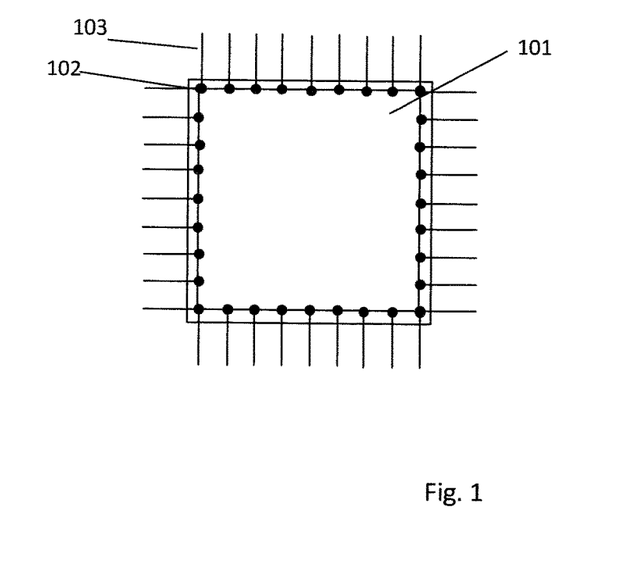
FIG. 1 shows a semiconductor component with wire bonds and wires.

FIG. 1 shows a semiconductor component 101, a plurality of wire bonds 102, and a plurality of wires 103. The wires 103 are connected on one end to the semiconductor component 101 and may be connected on the other end to a substrate or board. The semiconductor component 101 may have wire bonds which affix the wires. The wire bonds may be made of metal or any other electrically conductive material according to the known methods of creating wire bonds on a semiconductor component. It is generally anticipated, although not necessary, that each wire 103 has at least one bond 102 to affix the wire to the semiconductor component. A bond 102, however, is not limited to a single wire. A single bond 102 may incorporate a plurality of wires 103.

Figure 2:
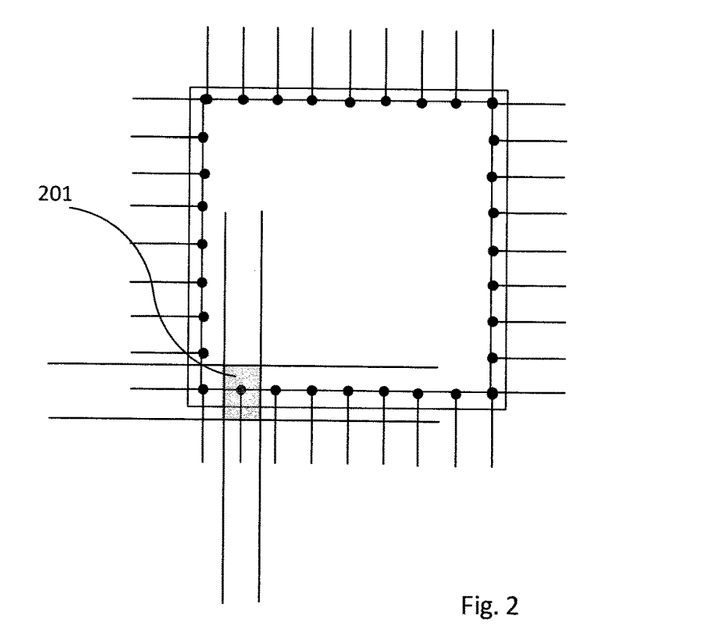
FIG. 2 shows an identification of wire bonds using Haar-like features.

FIG. 2 shows an identification of wire bonds using Haar-like features. Haar-like feature recognition is a method of optical recognition and is well known in facial recognition technologies. Haar-like feature analysis extracts various element from an image or a portion of the images, such as edge features, line features, or center-surround features. With an analysis of these features, Haar-like feature analysis is able to determine the presence and location of aspects within an image, such as, in this case, wire bonds. According to one aspect of the Disclosure, Haar-like features are used to identify wire bonds on the semiconductor component. This may involve an analysis of an image of the semiconductor component, whereby the image is evaluated using Haar-like images 201 to locate the presence of wire bonds. In 201, the evaluation using Haar-like images is depicted as an analysis of an area defined by two lines parallel to the x-axis and two lines parallel to the y-axis; however, this is not intended to be limiting, and a Haar-like feature analysis can be performed by any known method.

Figure 3:
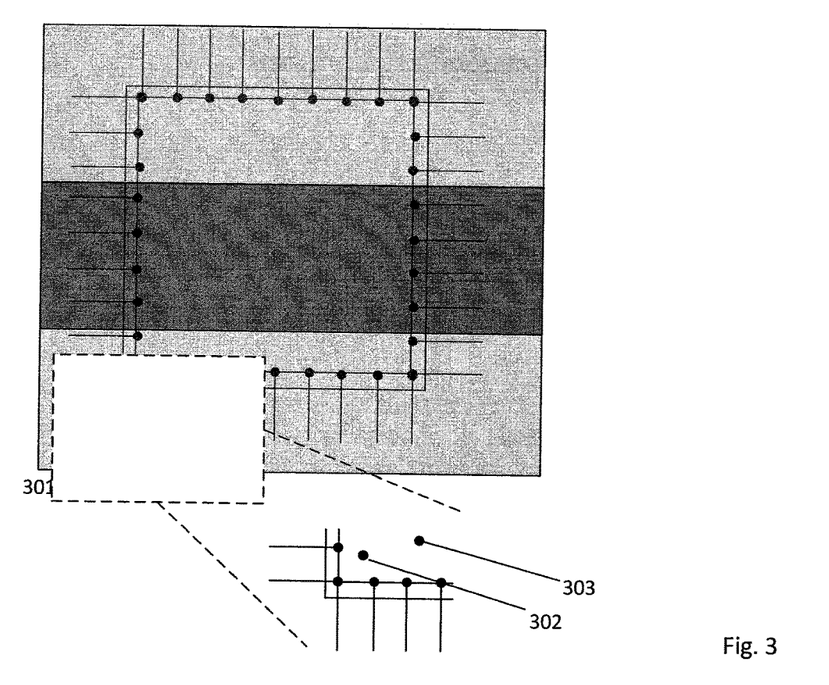
FIG. 3 shows an identification of wire bonds using cascade classifiers.

FIG. 3 shows an identification of wire bonds using cascade classifiers. Cascade classifiers are also a method of optical recognition and are well known in facial recognition technologies. Cascade classifiers rely on multiple layer classifiers, which reach a simple true or false decision at every layer. Although a cascade classifier decision may be rather rough after only one layer, the cascade clarifier decision may be very accurate after completing an entire range of classifiers. By working through the range of classifiers, the cascade classifier analysis is able to determine the presence and location of aspects within an image, such as, in this case, wire bonds. According to one aspect of the Disclosure, cascade classifiers are used to identify wire bonds on the semiconductor component. This may involve an analysis of an image of the semiconductor component, whereby the image is evaluated using cascade classifiers 301 to locate the presence of wire bonds. In 301, the evaluation using cascade classifiers is depicted as an analysis of an area, as shown by three horizontal stripes; however, this is not intended to be limiting, and a cascade classifier analysis can be performed by any known method. In the auto-learning procedure, the cascade classifier assesses a manually provided area of interest, which generally includes the entire lead frame or die area. This auto-learning procedure results in the identification of wire bonds based on an analysis of the image area.

One aspect of wire bond detection is the possibility of a false positive result, wherein the system detects the presence of a wire bond in a location where no wire bond is in fact present. This may be especially likely where a cascade classifier system is used. Thus, it may be necessary to perform additional filtration of the wire bond detection to eliminate false positives. This is shown in FIG. 3, wherein 302 and 303 are detected as false positives. According to one aspect of the disclosure, the false positives are detected by extracting multiple statistical features of the bond and designing a rules-based filter to separate real bonds from false detections. These statistical features may include area ratio, intensity ratio, template matching score, polar matching score, histogram correlation score, and/or edge correlation score. With these procedures, falsely detected wire bonds are identified and are deleted from further consideration so as to preferably prevent a region of interest being assigned to a falsely detected wire bond. Once the bonds are determined, each bond on the semiconductor component may be labeled for later reference.

Figure 4:
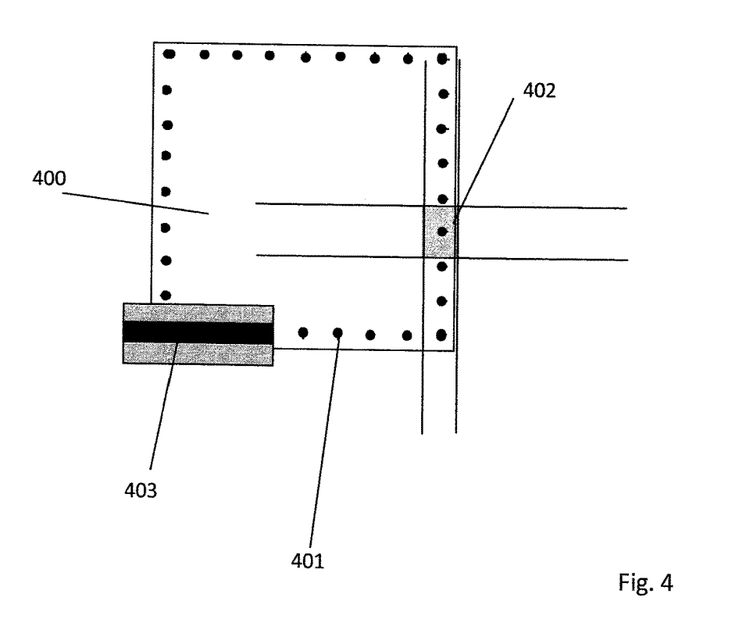
FIG. 4 shows a semiconductor component with detected wire bonds.

FIG. 4 shows the realization of a semiconductor component 400 comprising a plurality of identified wire bonds 401, wherein the semiconductor component has undergone a Haar-like feature detection process 402 and a cascade classifier detection process 403, and the results have been filtered as described in FIG. 3, above. At this stage, the system recognizes the wire bonds 401 but has not yet determined the locations of the wires connecting said bonds.

Figure 5:
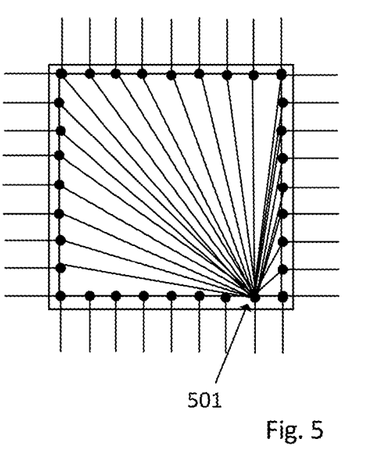
FIG. 5 shows a candidate detected wire set with candidate wires between a detected bond and all remaining bonds.

FIG. 5 shows the assumed connection of a detected bond to the remaining bonds. It may be quite inefficient to search for wires across the entire chip area, and therefore it may be useful to limit the search for wires to the areas between two wire bonds. This procedure is based on the assumption that all wires on the circuit will be connected to either the semiconductor component and/or the substrate with a wire bond. The system therefore employs a method of wire elimination to determine the location of wires. For each wire bond, the wire bond is initially assumed to have a wire connection between the wire bond and each of the other detected wire bonds 501. Because the semiconductor component area is especially valuable, wire bonds will generally be connected by the most direct route between them. As such, where connections beginning or ending with a detected wire bond are assumed to continue to each of the remaining wire bonds 501, only these assumed detections need to be inspected to determine the presence or absence of a wire.

Figure 6:
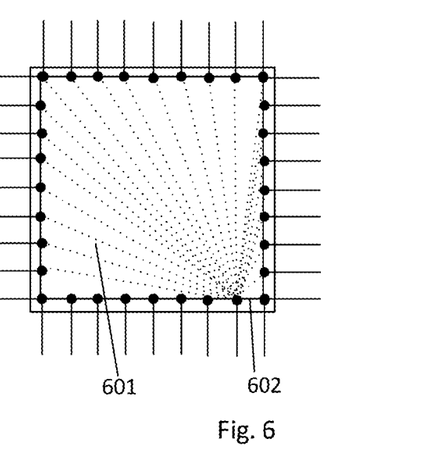
FIG. 6 shows the candidate detected wire set with eliminated non-existent connections.

Therefore, after assuming connections between a given wire bond and the remaining wire bonds, as shown in FIG. 5, each pathway between the given wire bond and the remaining wire bonds is inspected to determine the presence or absence of a wire, as shown in FIG. 6. As the pathways are inspected, either the presence of a wire is confirmed, or the presence of a wire is noted to be absent and the pathway is noted as having no wire 601. After inspecting the pathways between each given wire bond and each of the remaining wire bonds, and after marking the absence of wires along these paths based on the inspection results, the remaining data set should include each of the detected wires 602, and the false positives should be eliminated, as shown generally in FIG. 6.

Figure 7:
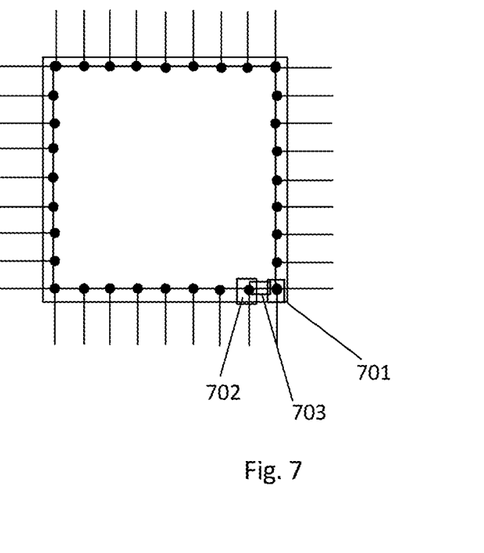
FIG. 7 shows identification of inspection regions of interest.

FIG. 7 shows the placement of a region of interest for a first wire bond 701, a region of interest for a second wire bond 702, and a region of interest for a connecting wire 703. Inspection regions of interest are generated based on pre-defined parameters which may include, but are not limited to, the size of the region of interest at the center of each bond. Each inspection region of interest may be generated automatically. Each inspection region may be labeled for reference.

Figure 8:
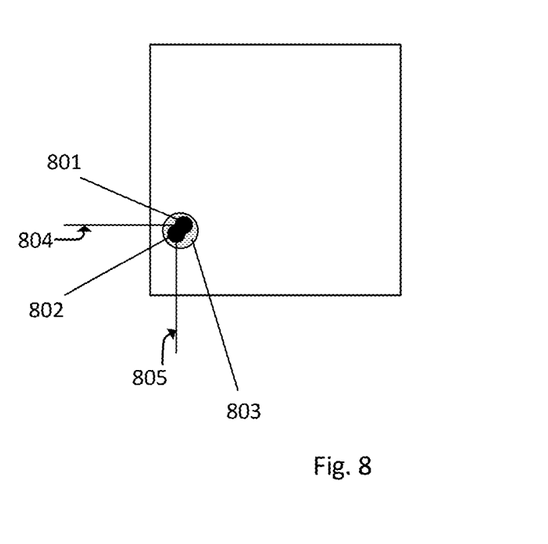
FIG. 8 shows merging of overlapping inspection regions of interest.

FIG. 8 shows a merging of overlapping regions of interest. In order to most effectively create regions of interest for the wire bonds, it is preferable to merge overlapping regions of interest into a single region of interest. FIG. 8 shows two regions of interest 801 and 802, wherein at least a portion of 801 overlaps with 802. This may be due to the actual presence of two wire bonds in close proximity to one another; two wires 804 and 805 in close proximity to one another; or generally features in close proximity. Where two regions of interest overlap, the system will combine them into a singular merged region of interest 803 for the purposes of further analysis. In FIG. 8, the singular merged region of interest 803 is shown as being slightly larger than the outermost portions of overlapping regions of interest 801 and 802. The area of the merged deleted wire bond region 803 relative to the two detected wire bonds 801 and 802 is adjustable and can be determined based on preconfigured settings.

Figure 9:
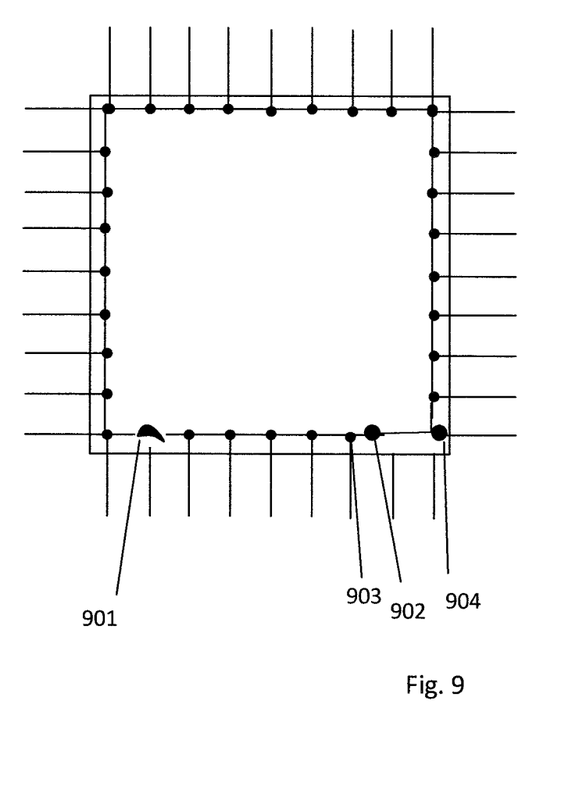
FIG. 9 shows inspection of bonds.

FIG. 9 shows the inspection of bonds based on the inspection regions of interest. In this wire bond inspection procedure, the cascade classifier is used to locate wire bonds by analyzing the image area in every inspection region of interest. These inspection regions of interest are generated automatically based on the procedures for identifying wire bonds, described above. During the inspection process, the regions of interest are inspected, and specifically the wire bonds are inspected for satisfactory quality. These inspections are performed based on one or more statistical features. The statistical features by which the bonds are inspected may include, but are not limited to, area ratio, intensity ratio, circularity, or distance between bonds. For example, irregularly shaped bond 901 will be detected based on at least circularity and marked as being unsatisfactory. Wire bond 902 is noticeably misplaced, as wire bond 902 is too close to wire bond 903 and too far from wire bond 904. Thus, wire bond 902 would be deemed unsatisfactory based on its distance between adjacent bonds.

Figure 10:
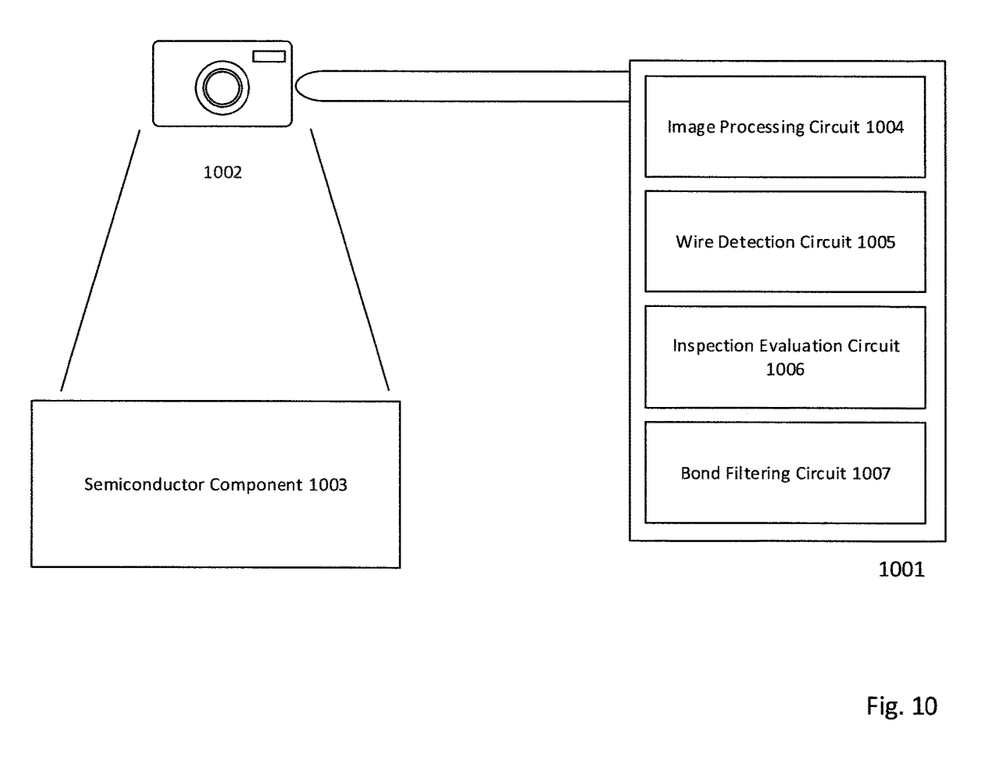
FIG. 10 shows a system for optical wire bond inspection.

FIG. 10 shows a system for optical wire bond inspection 1001, comprising an image acquisition device 1002, configured to obtain an image of a semiconductor component 1003; an image processing circuit 1004, configured to detect a plurality of wire bonds on the image of the semiconductor component 1003, a wire detection circuit 1005, configured to detect a wire between the plurality of detected wire bonds on the image of the semiconductor component; and an inspection evaluation circuit 1006, configured to determine an inspection region of interest on the image of the semiconductor component corresponding to at least one detected wire bond and at least one detected wire, and to inspect along the inspection region of interest. The system for optical wire bond inspection 1001 may additionally be equipped with a bond filtering circuit 1007, configured to identify a falsely detected wire bond. According to one aspect of the Disclosure, upon the bond filtering circuit identifying a falsely detected bond, it deletes a detection of said falsely detected bond, such that the falsely detected bond will not be assigned a region of interest.

Figure 11:
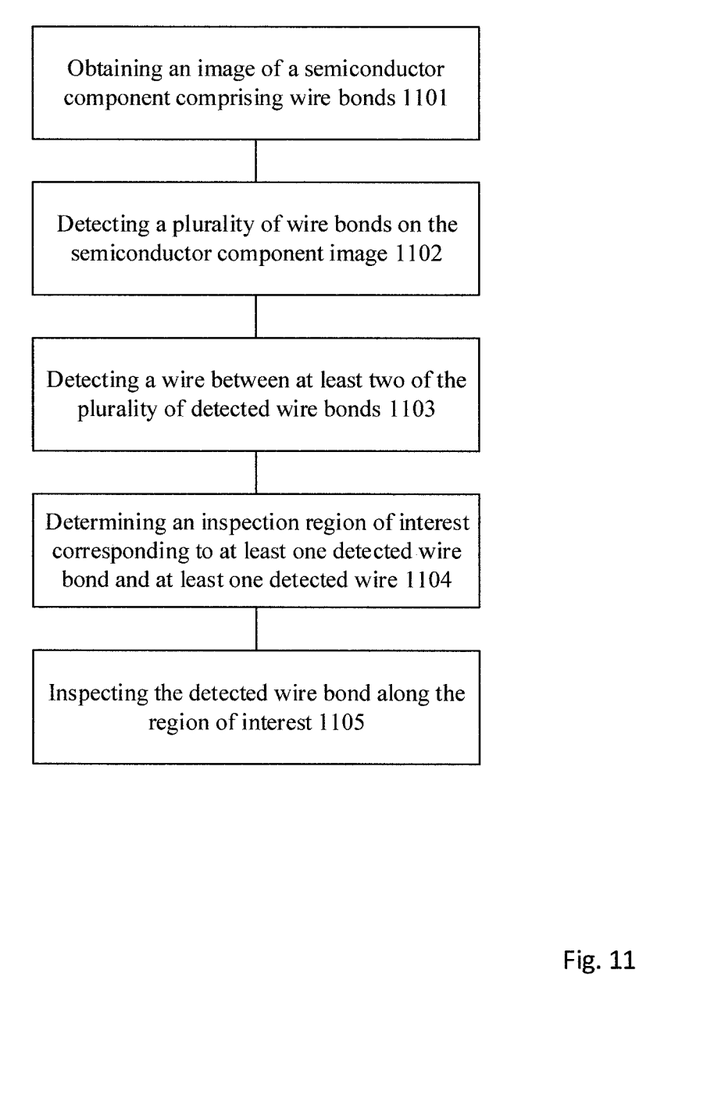
FIG. 11 shows a method for optical wire bond inspection.

FIG. 11 describes a method for optical wire bond inspection, comprising obtaining an image of a semiconductor component comprising wire bonds 1101; detecting a plurality of wire bonds on the semiconductor component image 1102; detecting a wire between at least two of the plurality of detected wire bonds 1103; determining an inspection region of interest corresponding to at least one detected wire bond and at least one detected wire 1104; and inspecting the detected wire bond along the region of interest 1105.

According to one aspect of the Disclosure, the analysis of the image for detecting positions of the wire bonds is performed using Haar-like features. According to another aspect of the Disclosure, the analysis of the image for detecting positions of the wire bonds is performed using cascade classifier. According to a third aspect of the Disclosure, the analysis of the image for detecting positions of the wire bonds is performed using Haar-like features and a cascade classifier. The positions of the detected wire bonds can be filtered based on one or more statistical features for removing positions of the wire bonds detected incorrectly, wherein the one or more statistical features are selected from the group consisting of area ratio, intensity ratio, template matching score, polar matching score, histogram correlation score and edge correlation score.

According to another aspect of the Disclosure, the system for optical wire bond inspection may use Cascade classifiers to locate wire bonds. A cascade classifier system is a known method for object recognition and generally involves training a computer circuit to recognize a specific object. The training is achieved through several positive images that show the object and several images that do not show the object. By analyzing these objects, the computer circuit can became quite adept at recognizing the objection that it has been training to identify.

According to another aspect of the Disclosure, the system for optical wire bond inspection may use Haar-like features to locate wire bonds. Haar-like features are digital features that are used in object recognition, such as facial recognition. A Haar-like feature analysis may take any form known in the art. One possible form of Haar-like recognition is to consider adjacent rectangular regions at various locations in an image of the semiconductor component. The pixel intensities of these areas can be totaled to calculate features of the image, such as areas that are darker or lighter. For example, Haar-like features may be used to locate wire bonds, where the bonds are a different color than the substrate onto which they are attached.

According to one aspect of the Disclosure, the system for optical wire bond inspection comprises a bond filtering circuit, configured to identify a falsely detected wire bond and remove the falsely detected wire bond from the plurality of detected wire bonds. Although the Disclosed bond detection system very reliably identifies existing wire bonds, it may also falsely identify non-existent wire bonds, thereby resulting in false positive detection. This is particularly true where cascade classifiers are used for the bond identification. Since the false detection of a wire bond may influence the creation of an inspection area of interest, and thus may result in additional or unnecessary wire inspections, there is utility in attempting to locate and eliminate wire bonds before inspections regions of interest are needlessly created. Although the means of area ration, intensity ration, template matching score, polar matching score, histogram correlation score and edge correlation score have been expressly listed as means for filtering false positive wire bond results, they are not exclusive, and it is expressly contemplated that other filtration methods may be selected as deemed appropriate.

According to another aspect of the Disclosure, the system for optical wire bond inspection may include a step to merge or harmonize overlapping identified wire bonds, or overlapping regions of interest. In the course of wire bond recognition, the system may identify two wire bonds where only one exists, or it may be unable to distinguish between wire bonds that are very close together. This may result in the system detecting wire bonds that overlap, or in identifying two overlapping regions of interest. In order to simplify inspection, where overlapping wire bonds or overlapping regions of interest are identified, the system may combine them into a single wire bond or a single region of interest.

According to another aspect of the Disclosure, the system for optical wire bond inspection may determine inspection regions of interest for the detected wire bonds and/or the detected wires. The size of the inspection regions of interest may correspond directly with the size of the detected wire bonds or wires, or, alternatively, the size of the inspection regions of interest may be larger or smaller than the size of the detected wire bonds or wires. The size of the inspection regions of interest may be determined based on predetermined parameters. Said predetermined parameters may include, but are not limited to, the size of the region of interest at the center of each bond.

According to another aspect of the Disclosure, after the inspection regions of interest are determined, the inspection regions of interest are inspected to evaluate the quality of the bond. This may include the bond being evaluated in a pass/fail examination, with a pass/fail result being issued upon conclusion of the inspection. The evaluation of the wire bonds may include inspecting the detected wire bonds for shape errors using area ratio; inspecting the detected wire bonds for shape errors using intensity ratio; inspecting the detected wire bonds for shape errors using circularity; inspecting the detected wire bonds for position errors; inspecting the detected wire bonds for position errors using statistical features; and/or inspecting the detected wire bonds for position errors using a distance between a first bond and an adjacent bond. This is not intended as an exhaustive list of the wire bond evaluation techniques or criteria.

According to another aspect of the Disclosure, the system for optical wire bond inspection may detect wires by determining a candidate detected wire set comprising connections between detected wire bonds, inspecting the semiconductor component to determine the presence or absence of a candidate detected wire, and updating the candidate detected wire set to include the absence or presence of the candidate detected wire. This method of wire detection reduces the computational complexity of searching the entire semiconductor component for the presence of wires. Rather, this method relies on the likelihood of wires being placed between wire bonds to limit the location of areas to be search for wires.

The image acquisition device used to obtain an image of the semiconductor component may be any device capable of obtaining an image, including, but not limited to a still camera or a video camera. The device may obtaining an image using the visible or invisible light spectrum, including, but not limited to, solar light, artificial visible light, x-rays, backscatter x-rays, millimeter waves, or otherwise.

According to another aspect of the disclosure, the system or method described herein may be a non-transitory machine-readable storage including machine-readable instructions that, when executed, implement a method or realize an apparatus as claimed in any preceding claim. This can be performed in conjunction with video or images from any source, to perform the semiconductor component analysis described herein.

The following examples pertain to additional aspects of the Disclosure:

In Example 1, a system for optical wire bond inspection is disclosed, comprising an image acquisition device, configured to obtain an image of a semiconductor component; an image processing circuit, configured to detect a plurality of wire bonds on the semiconductor component, a wire detection circuit, configured to detect a wire between the plurality of detected wire bonds; and an inspection evaluation circuit, configured to determine an inspection region of interest corresponding to at least one detected wire bond and at least one detected wire, and to inspect along the inspection region of interest.

In Example 2, the system for optical wire bond inspection of example 1 is disclosed, further comprising using a Haar-like features analysis to detect the plurality of wire bonds on the semiconductor component.

In Example 3, the system for optical wire bond inspection of examples 1 or 2 is disclosed, wherein the Haar-like features comprise edge features, line features, and center-surround features.

In Example 4, the system for optical wire bond inspection of any one of examples 1 to 3 is disclosed, further comprising using Cascade classifiers to detect the plurality of wire bonds on the circuit.

In Example 5, the system for optical wire bond inspection of example 4 is disclosed, wherein the cascade classifier is a multiple-layer classifier system that uses a true or false decision at each layer.

In Example 6, the system for optical wire bond inspection of example 4 or 5 is disclosed, wherein the cascade classifier's wire bond detection comprises wire bonds and falsely detected wire bonds.

In Example 7, the system for optical wire bond inspection of any one of examples 1 to 6 is disclosed, further comprising using a Haar-like features analysis and Cascade classifiers to detect the plurality of wire bonds on the semiconductor component.

In Example 8, the system for optical wire bond inspection of any one of examples 1 to 7 is disclosed, further comprising a bond filtering circuit, configured to identify a falsely detected wire bond.

In Example 9, the system for optical wire bond inspection of example 8 is disclosed, further comprising identifying the falsely detected wire bond using area ratio, intensity ratio, template matching score, polar matching score, histogram correlation score, or edge correlation score.

In Example 10, the system for optical wire bond inspection of example 8 or 9 is disclosed, further comprising using a rule-based filter to identify and remove falsely detected wire bonds.

In Example 11, the system for optical wire bond inspection of any one of examples 8 to 10 is disclosed, further comprising identifying the falsely detected wire bond using area ratio.

In Example 12, the system for optical wire bond inspection of any one of examples 8 to 11 is disclosed, further comprising identifying the falsely detected wire bond using intensity ratio.

In Example 13, the system for optical wire bond inspection of any one of examples 8 to 12 is disclosed, further comprising identifying the falsely detected wire bond using template matching score.

In Example 14, the system for optical wire bond inspection of any one of examples 8 to 13 is disclosed, further comprising identifying the falsely detected wire bond using polar matching score.

In Example 15, the system for optical wire bond inspection of any one of examples 8 to 14 is disclosed, further comprising identifying the falsely detected wire bond using histogram correlation score.

In Example 16, the system for optical wire bond inspection of any one of examples 8 to 15 is disclosed, further comprising identifying the falsely detected wire bond using edge correlation score.

In Example 17, the system for optical wire bond inspection of any one of examples 1 to 16 is disclosed, further comprising the inspection evaluation circuit merging two overlapping regions of interest to create a single region of interest.

In Example 18, the system for optical wire bond inspection of any one of examples 1 to 17 is disclosed, further comprising the inspection evaluation circuit determining an inspection region of interest based on a size of the region of interest at the center of a detected wire bond.

In Example 19, the system for optical wire bond inspection of any one of examples 1 to 18 is disclosed, further comprising inspecting the detected wire bonds for shape errors using area ratio.

In Example 20, the system for optical wire bond inspection of any one of examples 1 to 19 is disclosed, further comprising inspecting the detected wire bonds for shape errors using intensity ratio.

In Example 21, the system for optical wire bond inspection of any one of examples 1 to 20 is disclosed, further comprising inspecting the detected wire bonds for shape errors using circularity.

In Example 22, the system for optical wire bond inspection of any one of examples 1 to 21 is disclosed, further comprising inspecting the detected wire bonds for position errors.

In Example 23, the system for optical wire bond inspection of any one of examples 1 to 22 is disclosed, further comprising inspecting the detected wire bonds for position errors using statistical features.

In Example 24, the system for optical wire bond inspection of any one of examples 1 to 23 is disclosed, further comprising inspecting the detected wire bonds for position errors using a distance between a first bond and an adjacent bond.

In Example 25, the system for optical wire bond inspection of any one of examples 1 to 24 is disclosed, further comprising the wire detection circuit detecting wires by determining a candidate detected wire set comprising wire connections between a detected wire bond and all additional detected wire bonds; inspecting the semiconductor component to determine a presence or absence of a wire within the candidate detected wire set; and updating the candidate detected wire set to include the presence or absence of the candidate detected wire.

In Example 26, the system for optical wire bond inspection of any one of examples 1 to 25 is disclosed, further comprising the wire detection circuit detecting wires by determining a candidate detected wire set comprising connections between identified semiconductor component bonds, inspecting the semiconductor component to determine a presence or absence of a candidate detected wire, and updating the candidate detected wire set to include the absence or presence of the candidate detected wire.

In Example 27, the system for optical wire bond inspection of any one of examples 1 to 26 is disclosed, further comprising inspecting the wire bonds for shape errors using area ratio.

In Example 28, the system for optical wire bond inspection of any one of examples 1 to 27 is disclosed, further comprising inspecting the wire bonds for shape errors using intensity ratio.

In Example 29, the system for optical wire bond inspection of any one of examples 1 to 28 is disclosed, further comprising inspecting the wire bonds for shape errors using circularity.

In Example 30, the system for optical wire bond inspection of any one of examples 1 to 29 is disclosed, further comprising inspecting the wire bonds for position errors.

In Example 31, the system for optical wire bond inspection of any one of examples 1 to 30 is disclosed, further comprising inspecting the wire bonds for position errors using statistical features.

In Example 32, the system for optical wire bond inspection of any one of examples 1 to 31 is disclosed, further comprising inspecting the wire bonds for position errors using a distance between a first bond and an adjacent bond.

In Example 33, the system for optical wire bond inspection of any one of examples 1 to 32 is disclosed, further comprising determining an inspection region of interest using a predetermined parameter.

In Example 34, the system for optical wire bond inspection of any one of examples 1 to 33 is disclosed, further comprising generating an inspection region of interest for each detected wire bond and each detected wire.

In Example 35, the system for optical wire bond inspection of example 34 is disclosed, further comprising determining the inspection regions of interest automatically.

In Example 36, the system for optical wire bond inspection of any one of examples 1 to 35 is disclosed, further comprising inspecting along the regions of interest by evaluating the wire bonds for scratches.

In Example 37, the system for optical wire bond inspection of any one of examples 1 to 36 is disclosed, further comprising inspecting along the regions of interest by evaluating the wire bonds for edge chipping.

In Example 38, the system for optical wire bond inspection of any one of examples 1 to 37 is disclosed, further comprising inspecting along the regions of interest by evaluating the wire bonds for placement error.

In Example 39, the system for optical wire bond inspection of any one of examples 1 to 38 is disclosed, further comprising inspecting along the regions of interest by evaluating the wire bonds for missing wires.

In Example 40, the system for optical wire bond inspection of any one of examples 1 to 39 is disclosed, further comprising inspecting along the regions of interest by evaluating the wire bonds for long tail defect.

In Example 41, the system for optical wire bond inspection of any one of examples 1 to 40 is disclosed, further comprising inspecting along the regions of interest by evaluating the wire bonds by measurement of bond width.

In Example 42, the system for optical wire bond inspection of any one of examples 1 to 41 is disclosed, further comprising inspecting along the regions of interest by evaluating the wire bonds by measurement of bond height.

In Example 43, the system for optical wire bond inspection of any one of examples 1 to 42 is disclosed, further comprising inspecting along the regions of interest by evaluating the wire bonds by measurement of wire loop height.

In Example 44, the system for optical wire bond inspection of any one of examples 1 to 43 is disclosed, further comprising the inspection evaluation circuit inspecting with only four regions of interest being manually provided.

In Example 45, the system for optical wire bond inspection of example 44 is disclosed, wherein the four manually provided regions of interest are lead frame area, bond template on the lead frame, die area, and bond template on the die.

In Example 46, the system for optical wire bond inspection of example 44 or 45 is disclosed, wherein after receiving the four manually provided regions of interest, the system generates regions of interest for every bond and wire automatically.

In Example 47, the system for optical wire bond inspection of any one of examples 1 to 46 is disclosed, wherein the wire bond inspection is performed without a manually generated inspection protocol.

In Example 48, the system for optical wire bond inspection of any one of examples 1 to 47 is disclosed, wherein the system automatically generates inspection parameters and criteria based on a statistical model of a wire bond.

In Example 49, the system for optical wire bond inspection of any one of examples 1 to 48 is disclosed, wherein using Haar-like features and cascade classifiers to detect a wire bond is more accurate than using template matching.

In Example 50, the system for optical wire bond inspection of any one of examples 1 to 49 is disclosed, wherein using Haar-like features and cascade classifiers is faster than using template matching.

In Example 51, a method for optical wire bond inspection is disclosed, comprising obtaining a semiconductor component image comprising wire bonds; detecting a plurality of wire bonds on the semiconductor component image; detecting a wire between at least two of the plurality of detected wire bonds; determining an inspection region of interest corresponding to at least one detected wire bond and at least one detected wire; and inspecting the detected wire bonds along the regions of interest.

In Example 52, the method of example 51 is disclosed, further comprising identifying a falsely detected wire bond.

In Example 53, the method of example 52 is disclosed, further comprising deleting the falsely detected wire bond from the plurality of detected wire bonds.

In Example 54, the method of example 52 is disclosed, further comprising identifying the falsely detected wire bond using area ratio, intensity ratio, template matching score, polar matching score, histogram correlation score, or edge correlation score.

In Example 55, the method of any one of examples 51 to 54 is disclosed, further comprising merging two overlapping regions of interest to create a single region of interest.

In Example 56, the method of any one of examples 51 to 55 is disclosed, further comprising detecting the wire between at least two of the plurality of detected wire bonds by determining a candidate detected wire set comprising wire connections between a detected wire bond and all additional detected wire bonds; inspecting the semiconductor component image to determine a presence or absence of a wire within the candidate detected wire set; and updating the candidate detected wire set to include the presence or absence of the candidate detected wire.

In Example 57, a means is disclosed for wire bond inspection, configured to obtain a semiconductor component image comprising wire bonds; detect a plurality of wire bonds on the semiconductor component image; detect a wire between at least two of the plurality of detected wire bonds; determine an inspection region of interest corresponding to at least one detected wire bond and at least one detected wire; and inspect the detected wire bonds along the regions of interest.

In Example 58, an apparatus is disclosed, wherein the apparatus is configured to perform any of the methods as disclosed above.

In Example 59, a non-transitory machine-readable storage including machine-readable instructions is disclosed that, when executed, implements a method or realizes an apparatus as described in any preceding example.

In Example 60, machine-readable storage including machine-readable instructions is disclosed that, when executed, implements a method or realizes an apparatus as described in any preceding example.

In Example 61, the system for optical wire bond inspection of any one of Examples 1 to 50 is disclosed, wherein an auto-learning procedure is performed, using a user-defined region of interest.

In Example 62, the system for optical wire bond inspection of Example 61 is disclosed, wherein the user-defined region of interest is the area of the lead frame.

In Example 63, the system for optical wire bond inspection of Examples 61 or 62, wherein a cascade classifier system is used for the auto-learning procedure.

In Example 64, the system for optical wire bond inspection of any one of Examples 61 to 63, wherein a cascade classifier system is further used for inspection of the identified wire bonds within the identified region or regions of inspection interest.

In Example 65, the system for optical wire bond inspection of any one of Examples 1 to 64 is disclosed, wherein a region of interest for the auto-learning procedure is provided by the user and corresponds to the area of the lead frame.

In Example 66, the system for optical wire bond inspection of any one of Examples 1 to 65 is disclosed, wherein a region of inspection interest is the one or more areas identified through the auto-learning process as areas corresponding to wire bonds.

What is claimed is:

1. A system for optical wire bond inspection, comprising:
   an image acquisition device, configured to obtain an image of a semiconductor component;
   an image processing circuit, configured to detect a plurality of wire bonds on the image of the semiconductor component,
   a wire detection circuit, configured to detect a wire between the plurality of detected wire bonds on the image of the semiconductor component; and
   an inspection evaluation circuit, configured to determine an inspection region of interest corresponding to at least one detected wire bond, and to inspect the image of the semiconductor component along the inspection region of interest.

2. The system for optical wire bond inspection of claim 1, further comprising using a Haar-like features analysis and Cascade classifiers to detect the plurality of wire bonds on the image of the semiconductor component.

3. The system for optical wire bond inspection of claim 1, further comprising a bond filtering circuit, configured to identify a falsely detected wire bond.

4. The system for optical wire bond inspection of claim 3, further comprising identifying the falsely detected wire bond using area ratio.

5. The system for optical wire bond inspection of claim 3, further comprising identifying the falsely detected wire bond using intensity ratio.

6. The system for optical wire bond inspection of claim 3, further comprising identifying the falsely detected wire bond using template matching score.

7. The system for optical wire bond inspection of claim 3, further comprising identifying the falsely detected wire bond using polar matching score.

8. The system for optical wire bond inspection of claim 3, further comprising identifying the falsely detected wire bond using histogram correlation score.

9. The system for optical wire bond inspection of claim 3, further comprising identifying the falsely detected wire bond using edge correlation score.

10. The system for optical wire bond inspection of claim 1, further comprising the inspection evaluation circuit merging two overlapping regions of interest to create a single region of interest.

11. The system for optical wire bond inspection of claim 1, further comprising inspecting the detected wire bonds for shape errors using area ratio.

12. The system for optical wire bond inspection of claim 1, further comprising inspecting the detected wire bonds for shape errors using intensity ratio.

13. The system for optical wire bond inspection of claim 1, further comprising inspecting the detected wire bonds for shape errors by evaluating the wire bonds for circularity.

14. The system for optical wire bond inspection of claim 1, further comprising inspecting the detected wire bonds for position errors or for a distance between a first bond and an adjacent bond.

15. The system for optical wire bond inspection of claim 1, further comprising the wire detection circuit detecting wires on the image of the semiconductor component by determining a candidate detected wire set comprising wire connections between a detected wire bond and all additional detected wire bonds; inspecting the image of the semiconductor component to determine a presence or absence of a wire within the candidate detected wire set; and updating the candidate detected wire set to include the presence or absence of the candidate detected wire.

16. The system for optical wire bond inspection of claim 1, further comprising inspecting along the regions of interest by evaluating the wire bonds on the image of the semiconductor component for scratches, edge chipping, placement error, missing wires, long tail defect, bond width, bond height, or wire loop height.

17. A method for optical wire bond inspection, comprising:
  obtaining an image of a semiconductor component comprising wire bonds;
  detecting a plurality of wire bonds on the semiconductor component image;
  detecting a wire between at least two of the plurality of detected wire bonds;
  determining an inspection region of interest corresponding to at least one detected wire bond and at least one detected wire; and
  inspecting the detected wire bond along the region of interest.

18. The method of claim 17, further comprising identifying a falsely detected wire bond using area ratio, intensity ratio, template matching score, polar matching score, histogram correlation score, or edge correlation score.

19. The method of claim 17, further comprising merging two overlapping regions of interest to create a single region of interest.

20. The method of claim 17, further comprising detecting the wire between at least two of the plurality of detected wire bonds by determining a candidate detected wire set comprising wire connections between a detected wire bond and all additional detected wire bonds; inspecting the semiconductor component image to determine a presence or absence of a wire within the candidate detected wire set; and updating the candidate detected wire set to include the presence or absence of the candidate detected wire.

* * * * *